(12) United States Patent
Hettler et al.

(10) Patent No.: US 11,367,992 B2
(45) Date of Patent: Jun. 21, 2022

(54) HOUSING FOR AN ELECTRONIC COMPONENT, AND LASER MODULE

(71) Applicant: SCHOTT AG, Mainz (DE)

(72) Inventors: Robert Hettler, Kumhausen (DE); Michelle Fang, Singapore (SG)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 16/798,877

(22) Filed: Feb. 24, 2020

(65) Prior Publication Data

US 2020/0194965 A1 Jun. 18, 2020

Related U.S. Application Data

(62) Division of application No. 15/430,060, filed on Feb. 10, 2017, now Pat. No. 10,707,642.

(30) Foreign Application Priority Data

Feb. 10, 2016 (DE) .......................... 102016102327.2

(51) Int. Cl.
*H01S 5/02208* (2021.01)
*H01S 5/024* (2006.01)
*H01L 23/10* (2006.01)
*H01S 5/022* (2021.01)
(Continued)

(52) U.S. Cl.
CPC .......... *H01S 5/02208* (2013.01); *H01L 23/10* (2013.01); *H01S 5/022* (2013.01); *H01S 5/02216* (2013.01); *H01S 5/02251* (2021.01); *H01S 5/02415* (2013.01); *H01S 5/02469* (2013.01)

(58) Field of Classification Search
CPC .. H01S 5/02208; H01S 5/022; H01S 5/02284; H01S 5/02216; H01S 5/02415; H01S 5/02469; H01S 5/02236; H01L 23/10
See application file for complete search history.

(56) References Cited

U.S. PATENT DOCUMENTS

| 4,119,363 A | 10/1978 | Camlibel et al. |
| 4,399,541 A | 8/1983 | Kovats et al. |
| 4,708,429 A | 11/1987 | Clark et al. |

(Continued)

FOREIGN PATENT DOCUMENTS

| CN | 1395123 | 2/2003 |
| EP | 1271209 | 1/2003 |

(Continued)

OTHER PUBLICATIONS

3SP Technologies, "1999CHP" Jan. 2015.
Texas Instruments, "Hermetic Packages", National Semiconductor, Aug. 1999.

*Primary Examiner* — Yuanda Zhang
(74) *Attorney, Agent, or Firm* — Ohlandt, Greeley, Ruggiero & Perle, L.L.P.

(57) ABSTRACT

A housing for an electronic component, in particular for a laser diode, is provided. The housing includes a mounting area for the electronic component and has a lateral wall provided with a feedthrough for a light guide. The base wall of a basic body of the housing has both a heat sink for a thermoelectric cooler and a plurality of feedthroughs for pins for electrically connecting the electronic component.

22 Claims, 14 Drawing Sheets

(51) Int. Cl.
*H01S 5/02251* (2021.01)
*H01S 5/02216* (2021.01)

(56) References Cited

U.S. PATENT DOCUMENTS

| | | | |
|---|---|---|---|
| 4,752,109 A | 6/1988 | Gordon | |
| 4,865,410 A | 9/1989 | Estrada et al. | |
| 5,005,178 A | 4/1991 | Kluitmans | |
| 5,011,256 A | 4/1991 | Johnson et al. | |
| 7,061,949 B1 | 6/2006 | Zhou | |
| 8,391,326 B1* | 3/2013 | Tamaya | H01S 5/02469 372/36 |
| 8,908,728 B1* | 12/2014 | Huikai | H01S 5/02212 372/36 |
| 2002/0070045 A1 | 6/2002 | Musk et al. | |
| 2003/0026557 A1 | 2/2003 | Galeotti | |
| 2005/0058411 A1 | 3/2005 | Finot | |
| 2006/0197215 A1* | 9/2006 | Potter | B81C 1/00269 257/704 |
| 2007/0077013 A1* | 4/2007 | Nakagawa | G02B 6/4271 385/92 |
| 2010/0119231 A1 | 5/2010 | Kim | |
| 2010/0294787 A1* | 11/2010 | Trescher | H01L 23/049 220/694 |
| 2013/0286566 A1* | 10/2013 | Tsuduki | H05K 5/0091 361/679.01 |
| 2015/0055667 A1 | 2/2015 | Horn | |
| 2016/0204574 A1 | 7/2016 | Schwarz | |

FOREIGN PATENT DOCUMENTS

| | | | |
|---|---|---|---|
| JP | 61269337 A * | 11/1986 | H01L 23/10 |
| JP | S62276892 | 12/1987 | |
| JP | H01243488 | 9/1989 | |
| JP | H0336161 | 4/1991 | |
| JP | H0617260 | 3/1994 | |
| JP | H0864712 | 3/1996 | |
| JP | 2003174226 | 6/2003 | |
| JP | 2004186309 | 7/2004 | |
| JP | 2008135516 | 6/2008 | |
| JP | 2009044026 | 2/2009 | |
| JP | 2009135269 | 6/2009 | |
| JP | 2010123776 | 6/2010 | |
| JP | 2012156345 | 8/2012 | |
| JP | 2014215455 | 11/2014 | |
| JP | 2015023201 | 2/2015 | |

\* cited by examiner

17  Fig. 5a
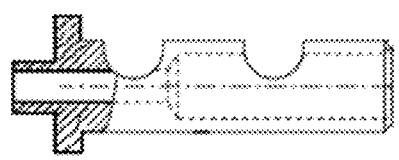
17  Fig. 5b
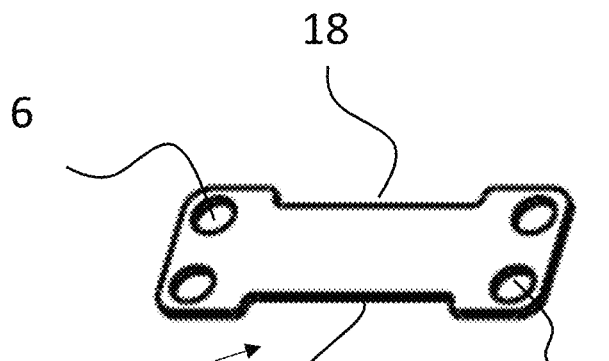
Fig. 6
5  Fig. 7
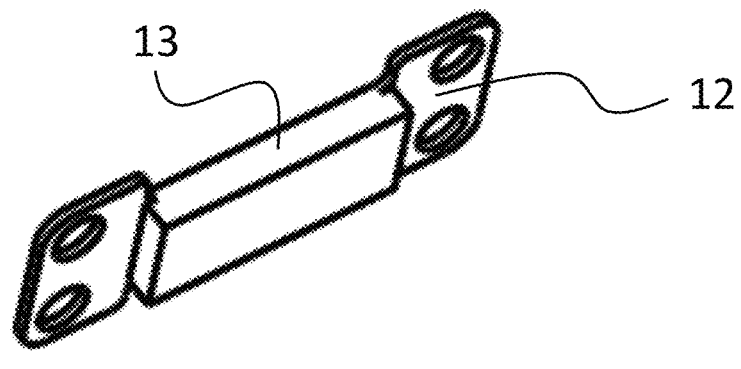
Fig. 8

HOUSING FOR AN ELECTRONIC COMPONENT, AND LASER MODULE

CROSS REFERENCE TO RELATED APPLICATIONS

This application is a divisional application of U.S. application Ser. No. 15/430,060 filed on Feb. 10, 2017, which claims benefit under 35 USC 119 of German Application 10 2016 102 327.2 filed Feb. 10, 2016, the entire contents of all of which are incorporated herein by reference.

BACKGROUND

1. Field of the Invention

The invention relates to a housing for an electronic component, in particular a housing for a high-power laser diode, and also relates to a laser module with a housing including a laser diode. More particularly, the invention relates to a so-called 10-pin package or 14-pin package.

2. Description of Related Art

Optoelectronic modules with a laser are known in particular for amplifying light signals over longer distances. They are used for optical pumping of fiber lasers. In particular so-called 10-pin butterfly packages are available on the market. In the assembled state, this is a hermetically sealed housing which has feedthroughs for pins in two opposite lateral walls, which pins serve to power the modules located in the housing. Such a housing is known from published document US 2002/0070045 A1, for example.

The housing consists of a basic body with the feedthroughs, the basic body defining a mounting area. Arranged in this mounting area is usually at least a laser diode, a thermoelectric cooler, and a thermistor as a temperature sensor. In order to prevent a shift in wavelength, the temperature of the laser diode is closed-loop controlled on the basis of the resistance value of the thermistor, so as to keep a constant temperature value.

In order to dissipate heat from the thermoelectric cooler, the housing comprises a heat sink usually mounted on the base wall thereof.

The basic body moreover has a feedthrough introduced into the lateral wall for connecting the light guide.

The manufacturing of such prior art housings for electronic components is complex. In particular the introduction of the feedthroughs into the lateral wall of the housing poses problems.

SUMMARY

Given this background, the object of the invention is to provide a housing for an electronic component, in particular in the form of an equipped laser module, which can be produced in a simple manner and which is of robust configuration and in particular exhibits high temperature stability.

The object of the invention is already achieved by a housing for an electronic component as disclosed herein and by a laser module which comprises a housing according to the invention and is equipped with a thermoelectric cooler and a laser diode.

Preferred embodiments and refinements of the invention are specified by the subject matter of the dependent claims, the description, and the drawings.

The invention relates to a housing for an electronic component.

In particular, the invention relates to a housing for a laser diode. More particularly, the invention relates to a housing that is hermetically sealed in its assembled state and is preferably designed as a 10-pin package.

The housing comprises a basic body with an upper end and a lower end. The lower end is the end which faces the printed circuit board in the mounted state.

The mounting area for the electronic component is located between the upper end and the lower end.

The basic body in particular has a trough-like shape and therefore comprises lateral walls between which the mounting area is located.

The basic body may be closed by a cover once the electronic component(s) have been assembled.

Furthermore, the basic body comprises a lateral wall with a feedthrough for a light guide.

In the simplest case, the feedthrough is provided in the form of a through-hole.

Usually, a light guide is mounted using a sleeve which is welded or soldered to the basic body and in which the light guide is embedded in a potting compound, in particular a solder.

This sleeve may as well be part of the basic body and may in particular be integrally formed with the basic body.

According to the invention, a base wall of the basic body comprises a heat sink for a thermoelectric cooler and moreover a plurality of feedthroughs for pins for electrically connecting the electronic component.

The pins are embedded in a potting compound in contrast to the basic body which is preferably made of metal.

The feedthroughs are in particular provided in the form of a glazing, preferably a compression glazing.

A compression glazing may be provided, for example, by introducing the pins together with a glass ring into a respective through-hole of the base wall. Then, the involved constituent parts are heated so that the glass solder melts. During cooling of the so glazed feedthrough the through-hole will contract more strongly due to a higher coefficient of thermal expansion of the material of the basic body, and will compress the glass feedthrough, in addition to the material bond with the adjacent basic body.

The heat sink for the thermoelectric cooler is also arranged on the base wall of the basic body. Thus, the pins and the thermoelectric cooler are mounted from the same direction, which simplifies manufacturing.

In the case where the feed-through is provided as a glazing it is in particular contemplated that in a single process step the glazing is produced by heating the involved constituent parts and at the same time the heat sink is brazed to the basic body.

The feedthroughs for the pins are preferably arranged adjacent to the heat sink.

It is in particular contemplated that the heat sink extends on the base wall of the basic body along a direction of the major extension of the housing, while the pins are arranged in rows adjacent to the heat sink next to the two major sides thereof.

The heat sink may project beyond the base wall of the basic body, as is contemplated according to one embodiment of the invention. In particular in the projecting portion, form fitting features for securing the housing may be provided, such as openings or recesses.

It is in particular contemplated to provide the housing equipped with the electronic components as an electronic device in the form of a surface mounted device (SMD).

In this case, the pins are angled laterally underneath the feedthrough so as to laterally project beyond the basic body.

The pins are spaced from the heat sink so that no insulation is required between the heat sink and the pins. This spacing moreover serves to compensate for any mechanical stress caused due to the different thermal expansion coefficients (circuit board, package). In this manner, introduction of such stress into the potting compound is reduced thereby increasing the reliability of the sealing. Preferably, the spacing between the pins and the heat sink is at least 0.2 mm.

In particular in the case of an SMD device, the heat sink should have form fitting features for mounting purposes.

However, according to another embodiment, a housing of the invention may as well be designed as a through-hole technology (THT) device. In this case, the pins are not angled but extend straight out of the base wall. In the case of this type of device the latter usually need not be secured to a printed circuit board in addition to the soldered pins.

In a preferred embodiment of the invention, the basic body is a deep drawn part.

The basic body is preferably made of a metal, in particular of steel or of an iron-nickel alloy.

The basic body preferably has a coefficient of thermal expansion between 5 and 20 ppm/K, most preferably between 11 and 15 ppm/K.

In a further embodiment of the invention, the base wall of the basic body has an increased thickness around the feedthroughs for the connection pins.

In particular a base wall is provided which base wall has a collar around the glazing.

Thus, the wall thickness is thereby increased around the feedthroughs compared to the adjacent area, which provides a sufficiently long path for the feedthrough which is preferably provided in the form of a glazing, despite the small wall thickness of the basic body which preferably is a deep drawn part.

The wall thickness of the basic body is preferably between 0.3 and 0.7 mm. If a thickening is provided around the feedthrough, the wall thickness in this area is preferably increased by at least 0.1, most preferably by at least 0.2 mm.

The heat sink preferably has a greater coefficient of thermal expansion than the basic body. Preferably, the heat sink is made of copper or of a copper alloy.

After joining of the components, for example by brazing, and glazing of the feedthroughs, the heat sink will contract to a greater degree, due to the higher coefficient of thermal expansion, and may thus cause an anisotropy of the pressure of the basic body on the glazing.

In operation, however, the heat sink will re-expand, which in turn counteracts this anisotropy, so that high temperature stability is provided despite of the material combination steel/copper.

However, as is contemplated according to one embodiment of the invention, the heat sink mounted to the basic body should keep a minimum spacing to the edge of the feedthrough in order to prevent the anisotropy mentioned above from becoming too pronounced.

However, a spacing between the heat sink and the edge of the glazing of at least 0.15 mm, preferably at least 0.2 mm, will be sufficient. In particular, the spacing is less than 0.7 mm, preferably less than 0.3 mm.

According to one embodiment of the invention, the base wall of the basic body has an opening for the heat sink.

The electronic component, in particular the thermoelectric cooler, can thus be directly mounted to the heat sink.

According to one embodiment, the heat sink is mounted to the lower surface of the base wall. In this embodiment, the solder is in particular located on a surface of the base wall of the basic body, so that a sufficiently large area for soldering the parts is ensured.

In particular in such an embodiment the heat sink may additionally comprise a projection protruding into the opening of the base wall or projecting beyond the base wall in the interior of the housing so as to project into the mounting area. As a result, the length of the wires for electrically connecting the electronic component may optionally be reduced.

In one embodiment of the invention, the heat sink comprises at least two materials having different coefficients of thermal expansion.

For example, it is contemplated to make the projection of the heat sink from a material which has a lower expansion coefficient than the rest of the heat sink, so as to be adapted to the thermal expansion coefficient of the thermoelectric cooler.

However, as contemplated according to another embodiment, it is also conceivable to provide a connection of the heat sink to the basic body at the edge face of the opening of the basic body.

In a further embodiment of the invention, the basic body comprises a form fitting feature in order to allow for only one insertion orientation in an assembly tool. Thus, the basic body has an asymmetric shape, for example, or may have a recess or indentation, so that it can only be introduced in one orientation during assembly. This further facilitates assembly.

Furthermore, at least the basic body preferably has a coating. In particular, the basic body has a nickel or gold coating.

According to one embodiment of the invention, the basic body and/or a cover to which the basic body is connected, comprises a circumferential ridge. This permits the basic body and the cover to be joined together in particularly simple manner by resistance welding. In this case, only a sufficient electrical current has to be introduced between the basic body and the cover. Since current density will be highest in the area of the ridge, a welded connection will be formed in a particularly simple manner in this area.

Alternatively, it is also conceivable to connect the basic body and the cover by roll seam welding.

The laser module comprising the housing is in particular configured as a laser module including a high-power laser diode with a maximum output power of at least 200 mW, preferably of at least 350 mW.

In particular it is provided in the form of a 10-pin package which includes a thermistor that can be used to control the temperature of the laser diode by means of the thermoelectric cooler.

It will be understood that the thermistor need not be provided in the form of a separate component but may as well be part of the laser diode or part of the thermoelectric cooler, for example.

The laser diode thus preferably emits radiation of a wavelength from 900 to 1000 nm.

BRIEF DESCRIPTION OF THE DRAWINGS

FIG. 5a shows a sleeve for connection of the light guide.

FIG. 5b shows another sleeve for connection of the light guide.

FIG. 6 shows a first embodiment of a heat sink.

FIG. 7 shows another embodiment of a heat sink.

FIG. 8 shows a different embodiment of a heat sink.

DETAILED DESCRIPTION

The subject matter of the invention will now be explained by way of exemplary embodiments of the invention with reference to the drawings of FIGS. 1 to 33.

Figure 1:
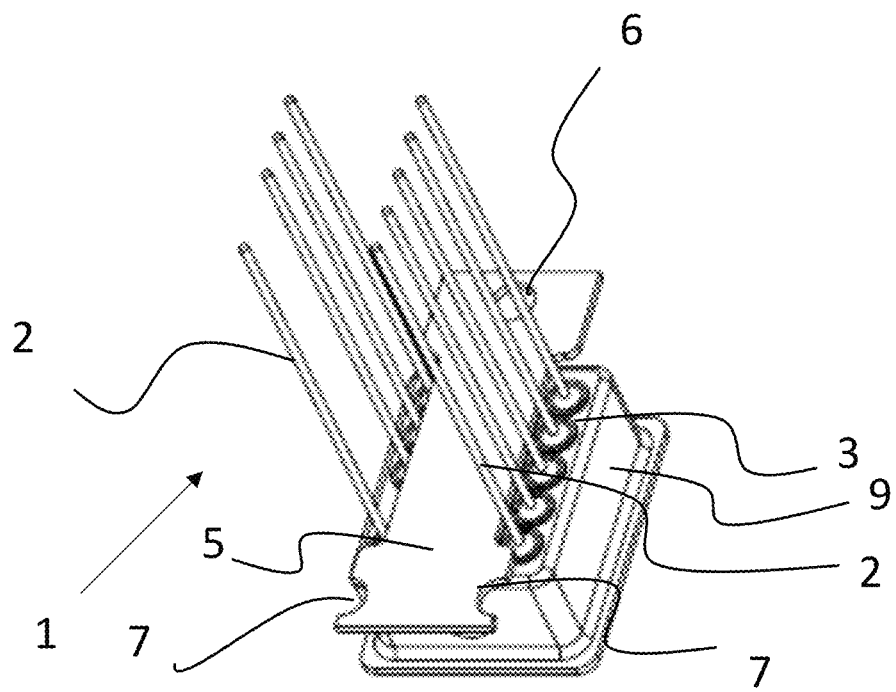
FIG. 1 is a top perspective view of a first exemplary embodiment of a housing for an electronic component.

FIG. 1 shows a perspective view of the lower end 3 of a housing 1 for an electronic component, in particular for a laser diode.

Housing 1 comprises a trough-shaped basic body 9 with an essentially rectangular outer shape.

In this view, pins 2 can be seen on the lower end 3 of the basic body, the pins extending out of the base wall of the basic body 9.

Pins 2 are arranged in two rows.

Between pins 2, a heat sink 5 is disposed, which is made of copper or other metals that exhibit high thermal conductivity.

Heat sink 5 protrudes beyond the base wall of basic body 9 and has a bore 6 at one end and recesses 7 at the other end, which are used as form fitting features for securing the housing 1.

Figure 2:
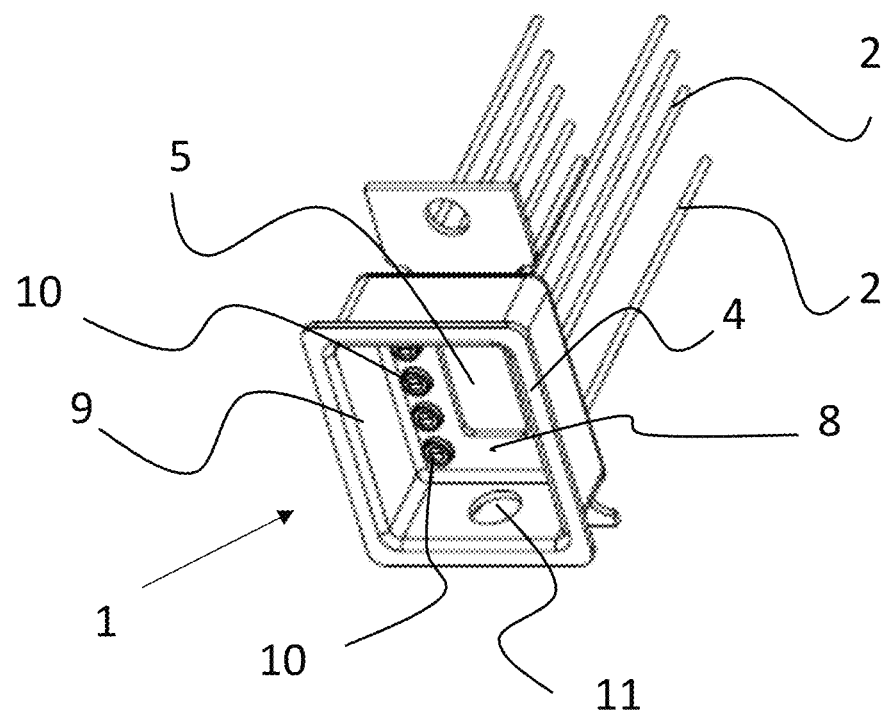
FIG. 2 is a bottom perspective view of FIG. 1.

FIG. 2 is a perspective view of the upper end 4 of the basic body 9 of housing 1.

As can be seen, the trough-shaped basic body 9 defines, in its interior, a mounting area for an electronic component (not shown).

Pins 2 have contact portions 10 at their ends, which are arranged in the interior of the housing 1.

Contact portions 10 serve to electrically connect the electronic components located in the housing.

More particularly, the housing 1 may comprise a respective pair of contact portions for each of a laser diode, a thermoelectric cooler, and a thermistor.

Furthermore, a feedthrough 11 in the form of a bore can be seen, through which a light guide (not shown) is introduced to be coupled with the laser diode.

In this exemplary embodiment, the base wall 8 of basic body 9 has an opening through which the heat sink 5 is accessible from the interior. Electronic components can therefore be mounted directly on the heat sink 5 within the housing.

Figure 3:
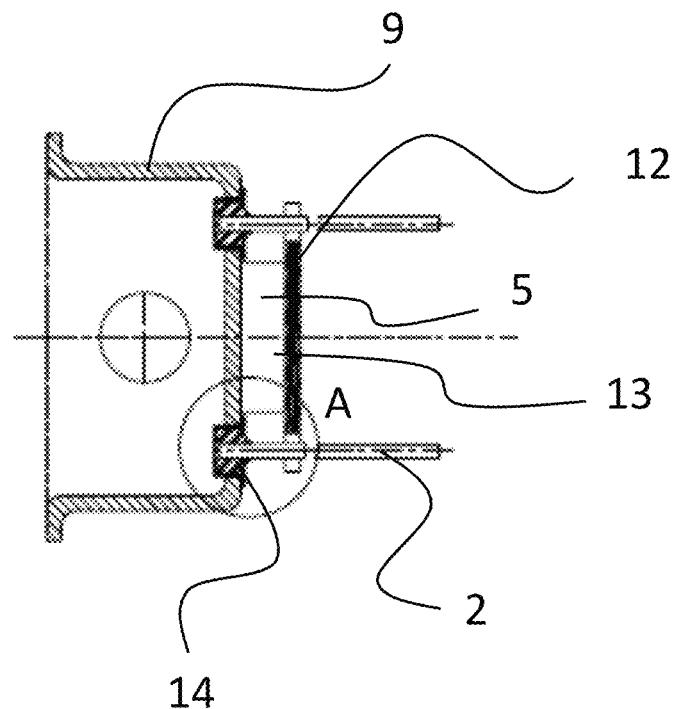
FIG. 3 is a sectional view of FIG. 1.

FIG. 3 is a sectional view of the housing shown in FIGS. 1 and 2, taken in parallel and close to a small end of the housing.

It can be seen that the basic body 9 has feedthroughs 14, through which the pins 2 extend into the interior of the housing.

Furthermore, it can be seen that the heat sink 5 consists of a plate 12 and a projection 13. The heat sink is connected to the basic body 9 through projection 13.

Figure 4:
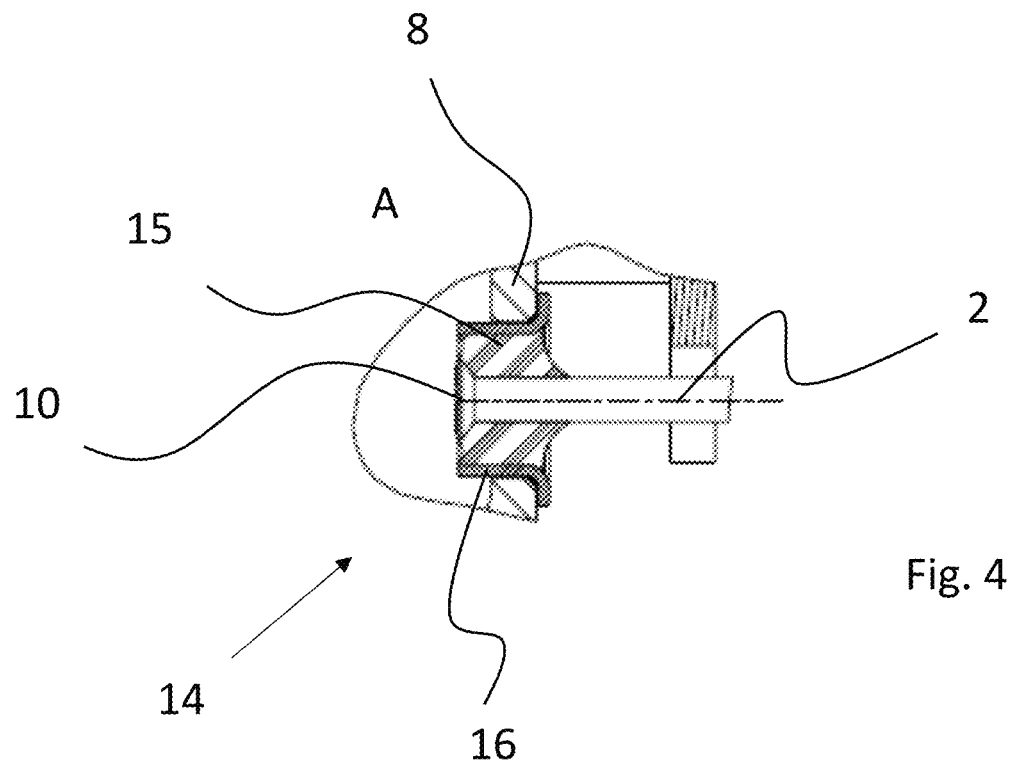
FIG. 4 is a detailed view of FIG. 3 taken at circle A.

FIG. 4 is a detailed view of section A around feedthrough 14.

Pin 2 is secured in the base wall 8 of the basic body by a glazing 15.

In this exemplary embodiment, pin 2 has a contact portion 10 of enlarged diameter to which the wires for electrically connecting an electronic component can be applied.

Furthermore, in this exemplary embodiment, an insert 16 is introduced into the opening of base wall 8 in order to increase the depth of glazing 15. The insert may be secured by brazing or welding, for example. Thus, the feedthrough provides a greater length than would be given by the base wall alone.

FIGS. 5a and 5b are schematic perspective views of a sleeve 17 which can be used in all the illustrated embodiments for connecting the light guide.

Sleeve 17 as shown in FIG. 5a is adapted for being mounted in the feedthrough of the basic body by being snap connected therein.

The embodiment of a sleeve 17 as illustrated in FIG. 5b has a flange serving to secure the sleeve by welding.

Thus, in a preferred embodiment of the invention, the sleeve 17 is a separate component which is welded or brazed to the basic body. Therefore, the basic body can be provided as a deep drawn part.

FIGS. 6 to 8 are perspective views of different exemplary embodiments of a heat sink.

The heat sink 5 shown in FIG. 6 has bores 6 serving as a form fitting feature for mounting the housing.

Along the major edges between the ends of heat sink 5, the latter has recesses 18 extending transversely to the main extension direction. In the area of these recesses 18, the pins can extend outwards adjacent to heat sink 5.

FIG. 7 shows a simple heat sink 5 in the form of a plate. Such a heat sink is in particular provided in conjunction with a housing of a THT device design, since such a housing is usually secured solely through the soldered pins.

FIG. 8 shows an embodiment of a heat sink consisting of a plate 12 and a projection 13 protruding from plate 12. The plate, again, has form fitting features for mounting purposes, in particular bores.

Projection 13 may either be fastened with its front face to the base wall of the basic body or may protrude into an opening of the basic body.

Furthermore, projection 13 may serve to increase the spacing between the basic body and the circuit board in the mounted state, so that the pins can extend laterally outwards through the resulting intermediate space.

Such a heat sink 5 with projection 13 is preferably provided as a one-piece part, in particular as a milled part. However, it is also conceivable for heat sink 5 to be provided as a two-part component, for example in the form of a projection 13 brazed to plate 12.

A heat sink may either be made of the same materials or as a hybrid component made of two different materials. The latter approach offers the possibility to make the base of a material with a lower thermal expansion coefficient adapted to that of the thermoelectric cooler, and the plate of a material with higher thermal conductivity, for example.

Figure 9:
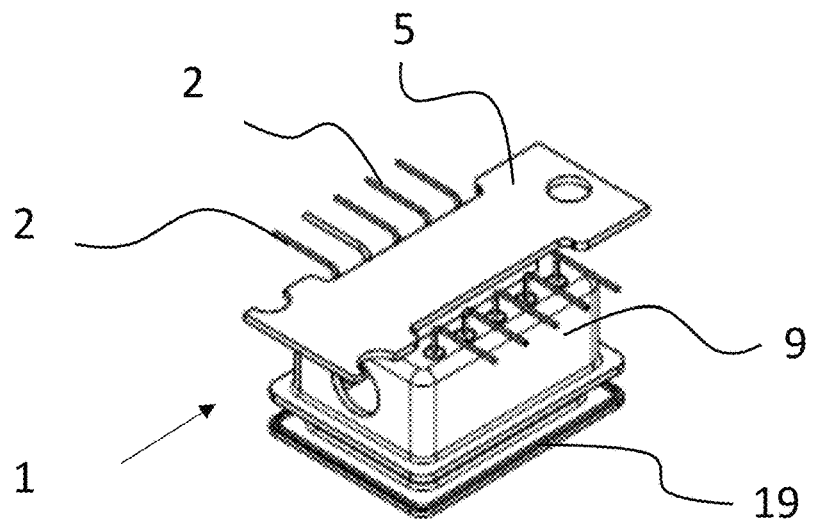
FIG. 9 is a top perspective view of a second exemplary embodiment of a housing for an electronic component.

FIG. 9 is a perspective view of another embodiment of a housing 1.

This housing again comprises a trough-shaped basic body 9 with a heat sink 5 mounted to the lower end thereof. Pins 2 extend laterally outwards, so this is an SMD device.

In the assembled state, the basic body 9 may be closed by a cover 19. Cover 19 is preferably connected by welding.

Figure 10:
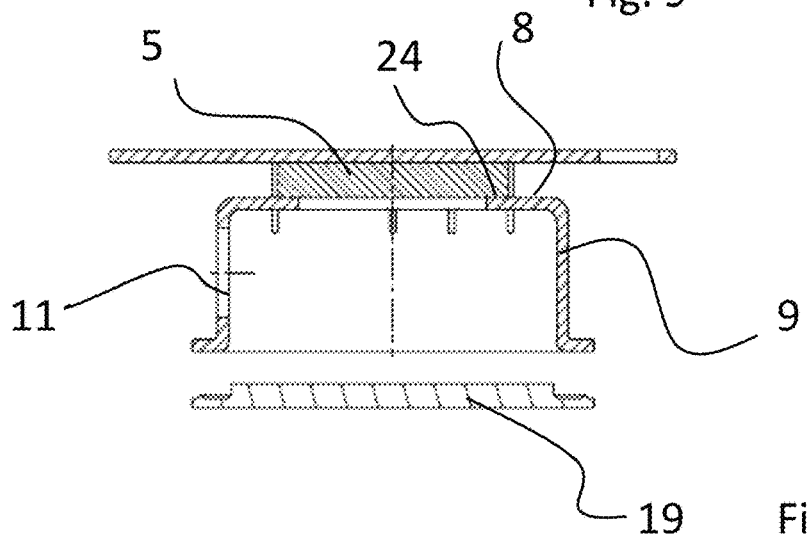
FIG. 10 is a sectional view of FIG. 9.

FIG. 10 is a longitudinal sectional view of the housing of FIG. 9.

Again, the basic body 9 in the form of a deep drawn part can be seen here, with feedthrough 11 for the light guide.

Furthermore, it can be seen that the heat sink 5 has a projection which is mounted with its front face to the base wall 8 of basic body 9. The connection is made by brazing, and in this exemplary embodiment a sufficiently large circumferential braze connection area 24 is easily provided.

Figure 11:
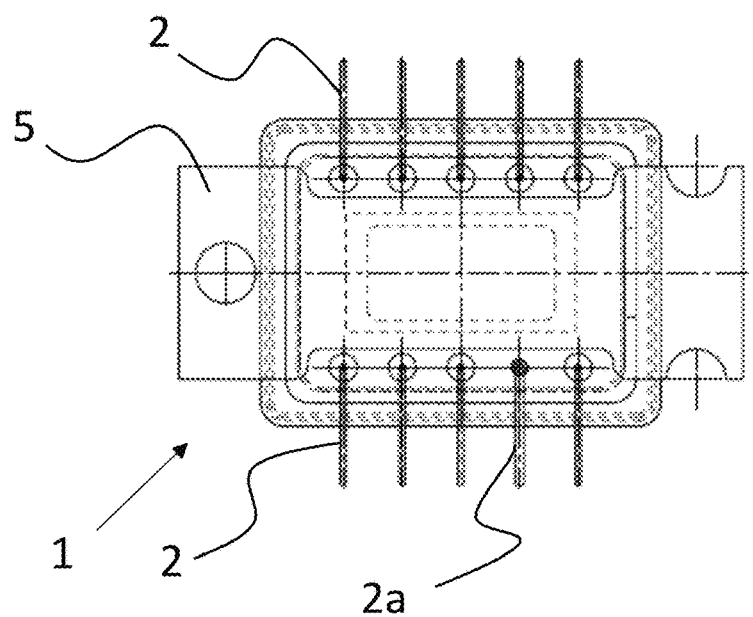
FIG. 11 is a top view of FIG. 9.

FIG. 11 is a plan view of the lower end of the housing 1. Pins 2 can be seen, emerging adjacent to heat sink 5 and extending laterally outwards.

Only pin 2a does not extend through a feedthrough, but is directly connected to the basic body, since it serves as a grounding pin.

Figure 12:
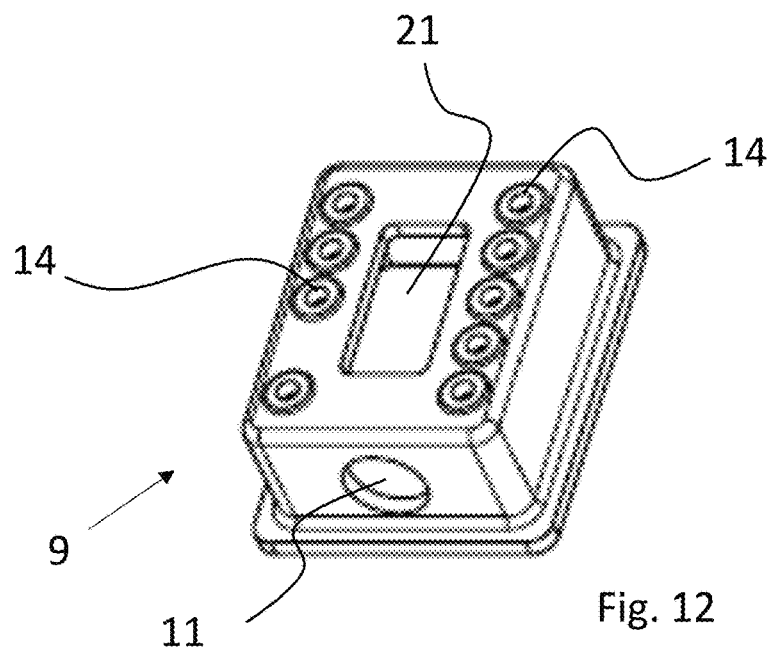
FIG. 12 is a perspective view of the basic body according to one embodiment of a housing.

FIG. 12 is a perspective view of one exemplary embodiment of a basic body 9.

This basic body 9 again has a trough-shaped design.

The basic body 9 has a feedthrough 11 for a light guide in a lateral wall thereof.

Furthermore, the base wall of the basic body 9 has a rectangular opening 21 in its lower surface, through which the heat sink of the assembled housing is exposed to the interior thereof.

Furthermore, nine feedthroughs 14 for the pins for connecting the electronic components mounted in the housing can be seen.

Figure 13:
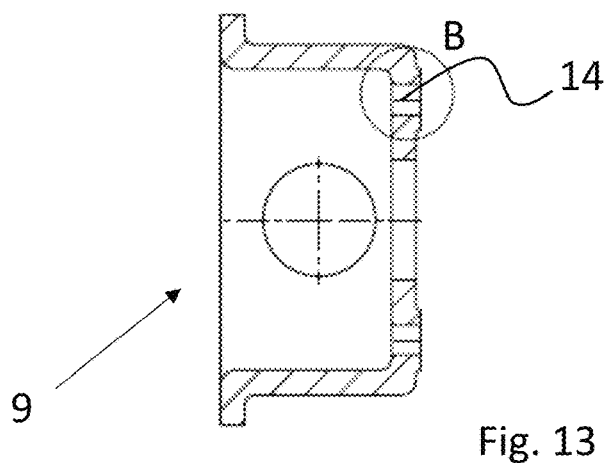
FIG. 13 is a sectional view of FIG. 12.

FIG. 13 is a sectional view of the basic body 9 illustrated in FIG. 12.

Feedthroughs 14 are visible.

Figure 14:
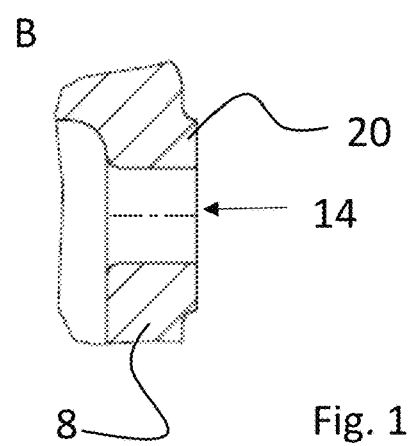
FIG. 14 is a detailed view of FIG. 13 take at circle B.

FIG. 14 is an enlarged view of section B in FIG. 13.

As can be seen, the base wall of the basic body has a collar 20 around feedthrough 14, so that the base wall has an increased wall thickness in the region around feedthrough 14 as compared to the adjacent area. In this manner, the glazing to be introduced into the feedthrough 14 will have a sufficient length even in the case of a deep drawn part of thin wall thickness.

Such a thickening of the collar around feedthrough 14 is preferably obtained by embossing, for example simultaneously with the deep drawing.

Figure 15:
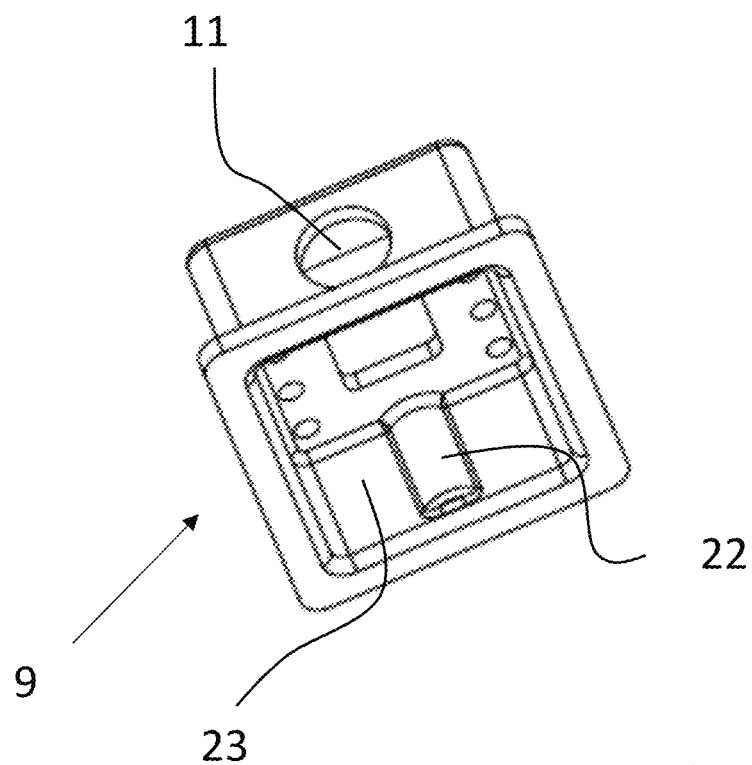
FIG. 15 is a top perspective view of a further embodiment of a basic body.
Figure 16:
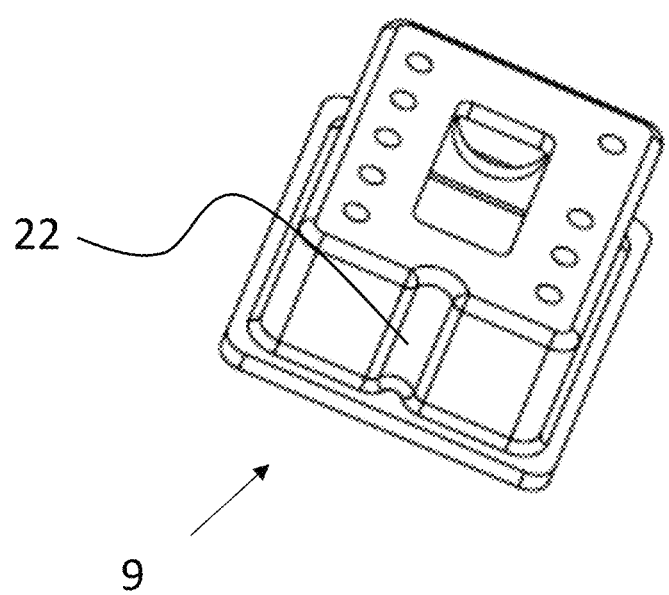
FIG. 16 is a bottom perspective view of FIG. 15.

FIGS. 15 and 16 are perspective views of another embodiment of a basic body 9.

As can be seen in FIG. 15, this basic body 9 also has a lateral wall with a feedthrough for a light guide.

It can also be seen that on one side an inwardly projecting indentation 22 is formed in the lateral wall 23 of the small end.

As can be seen particularly clearly in FIG. 16, the indentation 22 provides a simple form fitting feature which ensures that during assembly the basic body 9 can be inserted into a mounting tool (not shown) in only one orientation.

Figure 17:
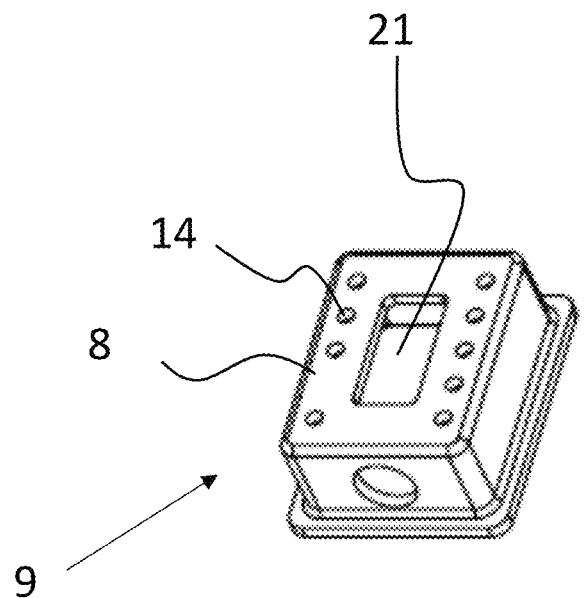
FIG. 17 is a top perspective view of a further embodiment of a basic body.
Figure 18:
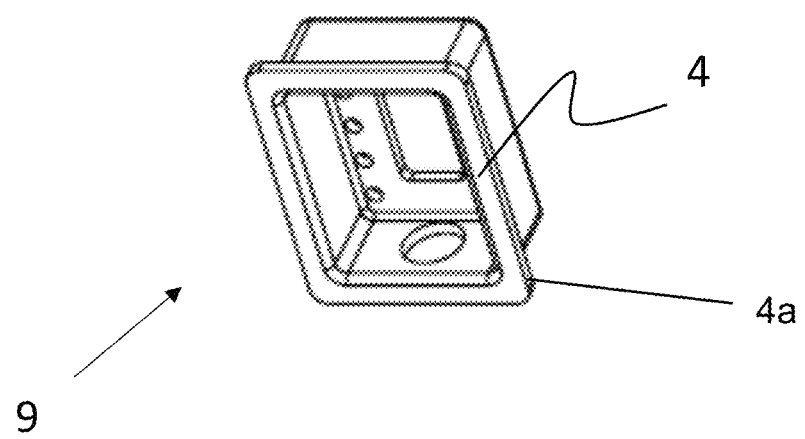
FIG. 18 is a bottom perspective view of FIG. 17.

FIGS. 17 and 18 are perspective views of a further embodiment of a basic body 9.

As can be seen in FIG. 17, in this exemplary embodiment the base wall 8 is not thickened around the feedthroughs 14 for the pins.

However, the base wall also has an opening 21 for the heat sink.

In FIG. 18 it can be seen that like in the other previously illustrated exemplary embodiments the basic body 9 has a collar 4a at its upper end 4, on which a cover can be attached.

Figure 19:
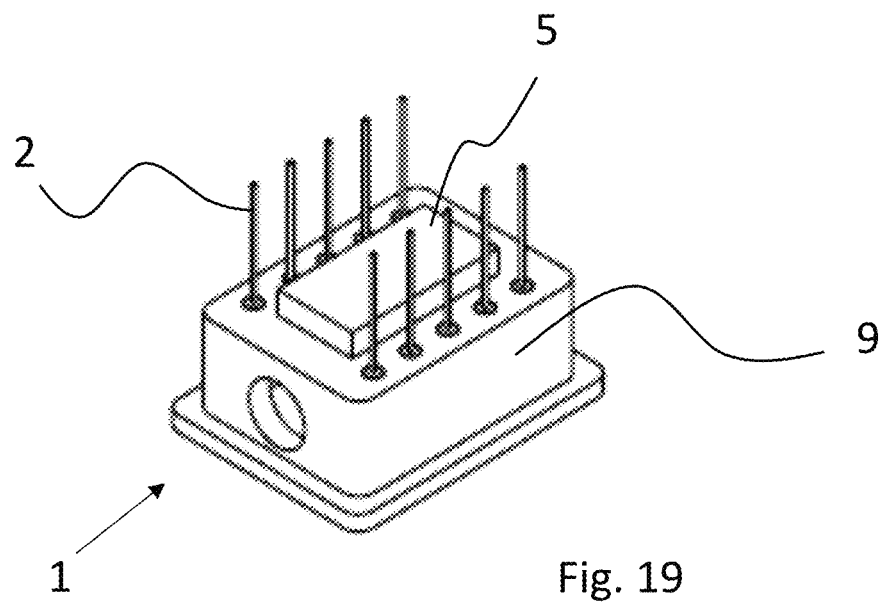
FIG. 19 is a perspective view of another embodiment of a housing.

FIG. 19 shows a further exemplary embodiment of a housing 1 in a perspective view.

In the case of this housing, a simple plate-shaped heat sink 5 is placed on the basic body 9.

The pins 2 are not angled but extend straight from the base wall. Thus, this device is intended for THT mounting.

Figure 20:
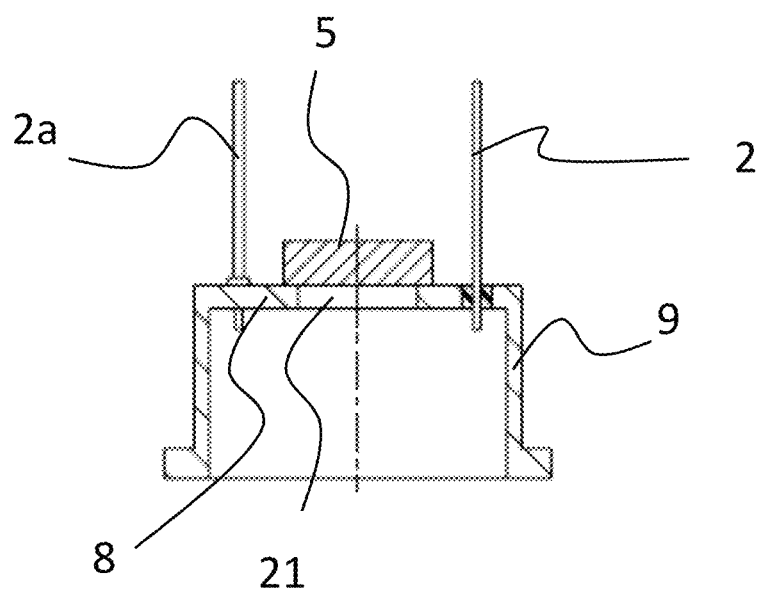
FIG. 20 is a sectional view of FIG. 19.

FIG. 20 is a sectional view of FIG. 19.

A pin 2 for contacting an electronic component can be seen, which extends through a feedthrough, and furthermore a pin 2a which serves as a grounding terminal.

Base wall 8 has an opening, and the plate-shaped heat sink is soldered with its front face to the base wall 8 without protruding into the interior of the housing. This provides additional installation space, for example if rather thick components are assembled.

Figure 21:
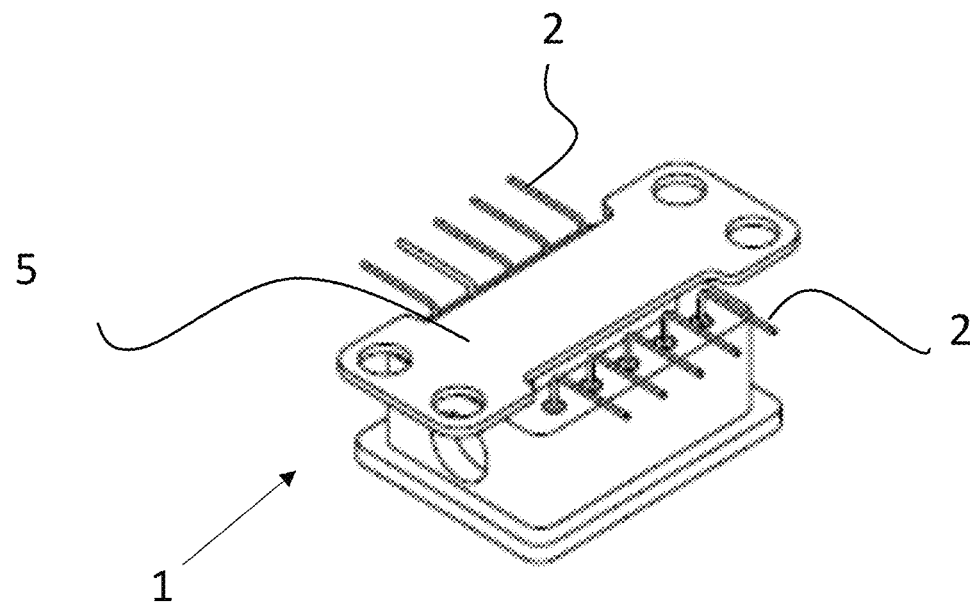
FIG. 21 is a perspective view of another embodiment of a housing.

FIG. 21 shows a further exemplary embodiment of a housing, which is designed for SMD mounting.

For this purpose, the pins 2 which are arranged adjacent to the bone-shaped heat sink 5 are angled so as to project laterally outwards.

Figure 22:
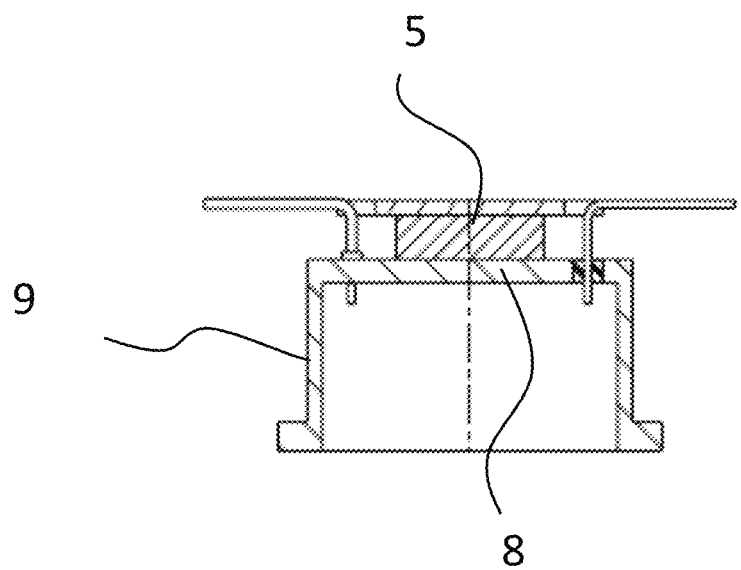
FIG. 22 is a sectional view of FIG. 21.

FIG. 22 is a sectional view of FIG. 21.

It can be seen that in this exemplary embodiment the base wall 8 of the basic body 9 does not have any opening for the heat sink 5.

Rather, in this exemplary embodiment of the invention, cooling is achieved by heat conduction across the base wall 8 of the basic body to heat sink 5. Since the basic body preferably is a deep drawn part with a small wall thickness, it will not be necessary in many cases to introduce an opening into the base wall.

Figure 23:
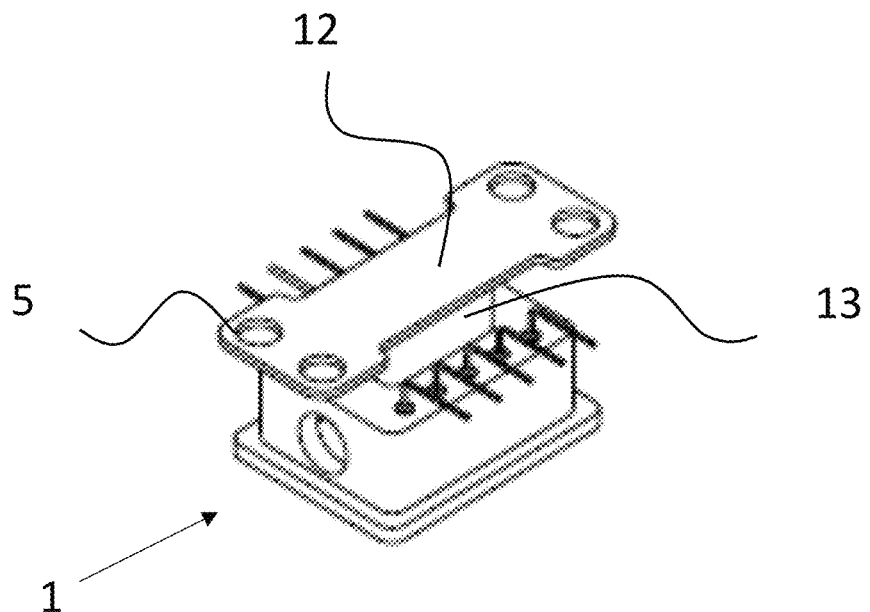
FIG. 23 is a perspective view of another embodiment of a housing.
Figure 24:
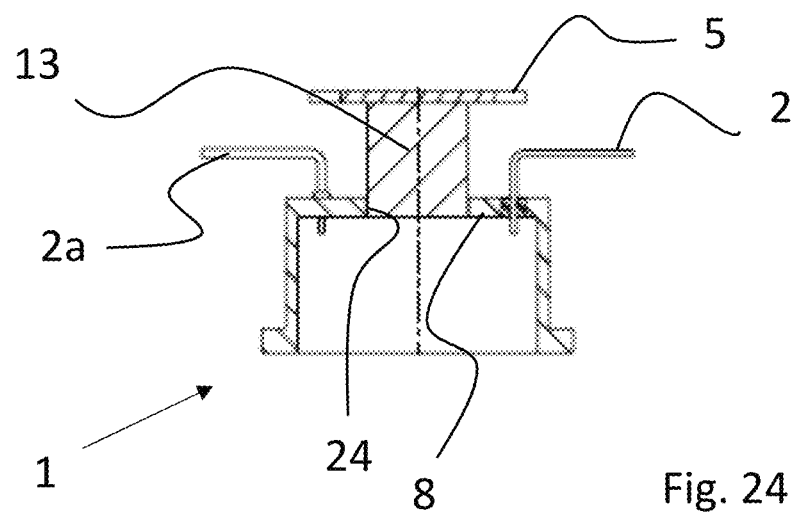
FIG. 24 is a sectional view of FIG. 23.

FIGS. 23 and 24 show a further embodiment of a housing.

In this embodiment, the heat sink 5 comprises a plate 12 and a projection 13, as is particularly apparent from FIG. 23.

As can be seen from the sectional view of FIG. 24, the projection 13 is inserted in an opening of base wall 8.

Therefore, the solder connection 24 is made laterally.

In this exemplary embodiment of the invention, the heat sink 5 terminates flush with the base wall 8 at the inner side of housing 1.

Figure 25:
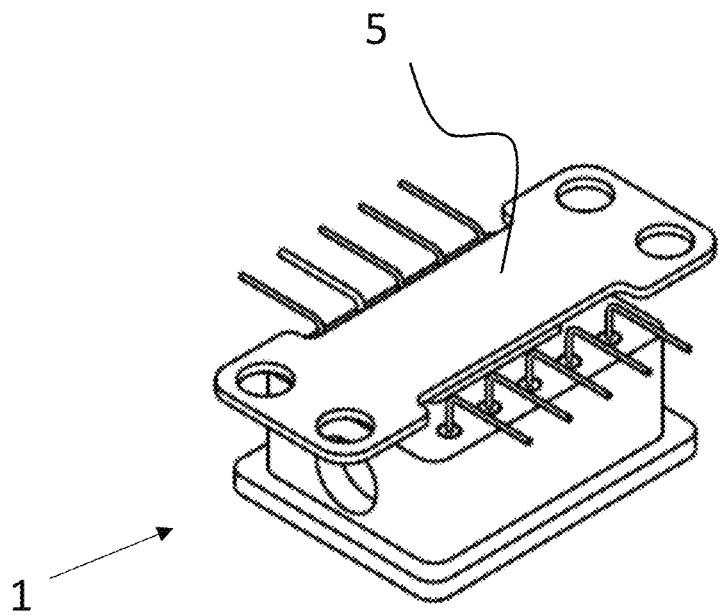
FIG. 25 is a perspective view of another embodiment of a housing.

FIG. 25 shows a perspective view of a further exemplary embodiment of a housing with a heat sink 5.

Figure 26:
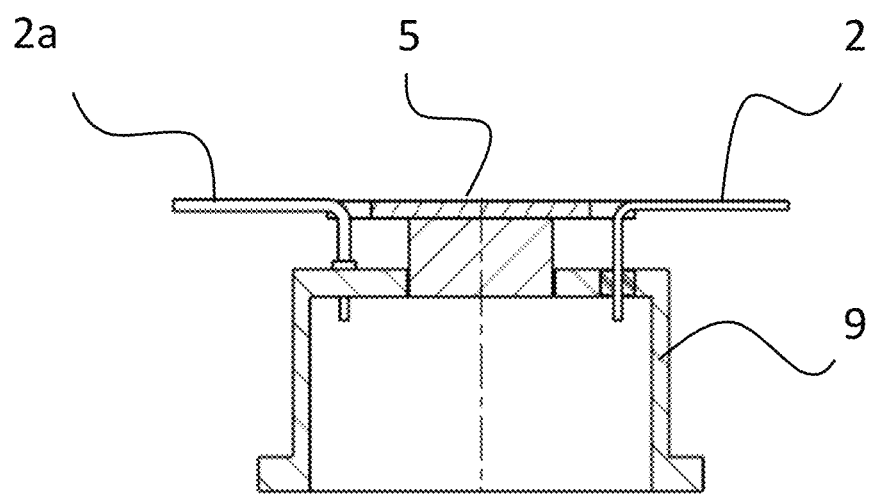
FIG. 26 is a sectional view of FIG. 25.

As can be seen in the sectional view of FIG. 26, the pins 2, 2a extend laterally away from heat sink 5.

The laterally projecting pins extend approximately at the same level as heat sink 5, whereas in the exemplary embodiment shown in FIGS. 23 and 24 the heat sink has such a height that the lower end of the heat sink is spaced from the pins.

Figure 27:
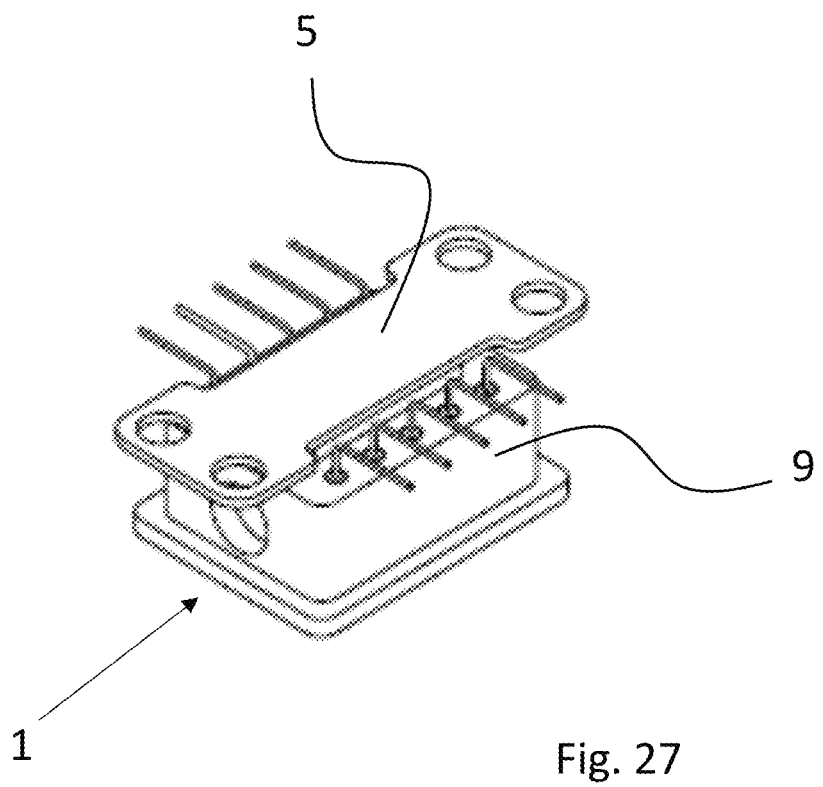
FIG. 27 is a perspective view of another embodiment of a housing.
Figure 28:
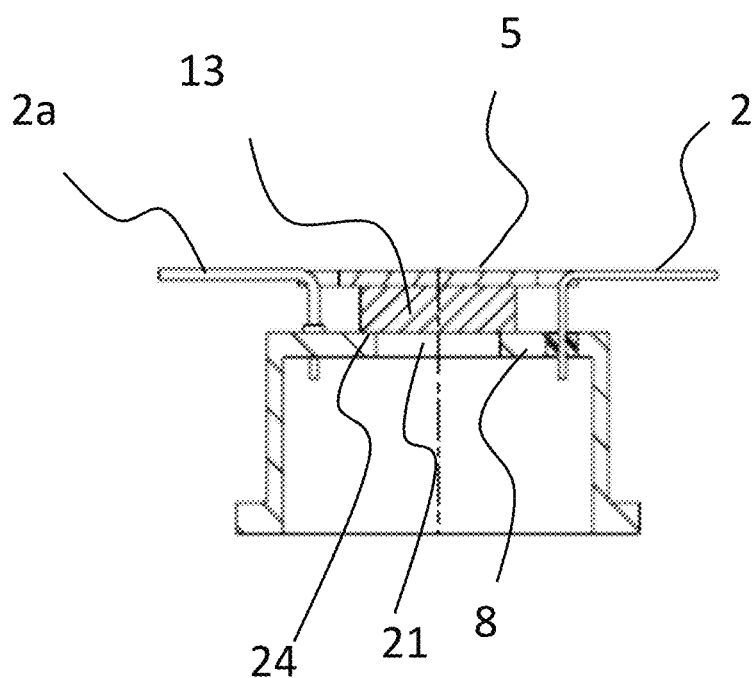
FIG. 28 is a sectional view of FIG. 27.

FIGS. 27 and 28 show a further embodiment of a housing 1. As can be seen from FIG. 27, the housing 1 comprises a trough-shaped basic body 9 and a heat sink 5 corresponding to that of the embodiment shown in FIG. 21 when looking at the lower end.

As can be seen in FIG. 28, the heat sink 5 comprises a projection 13 which is soldered to the lower surface of the basic body. The base wall 8 of basic body 9 has an opening 21, so that an electronic component can be placed directly onto the projection 13 of the heat sink 5.

However, the solder connection 24 is made on the lower surface of base wall 8 and is therefore not produced laterally, in contrast to the embodiment illustrated in FIG. 26.

In this exemplary embodiment, again, pins 2 and 2a extend laterally outwards, therefore this is an SMD device.

Figure 29:
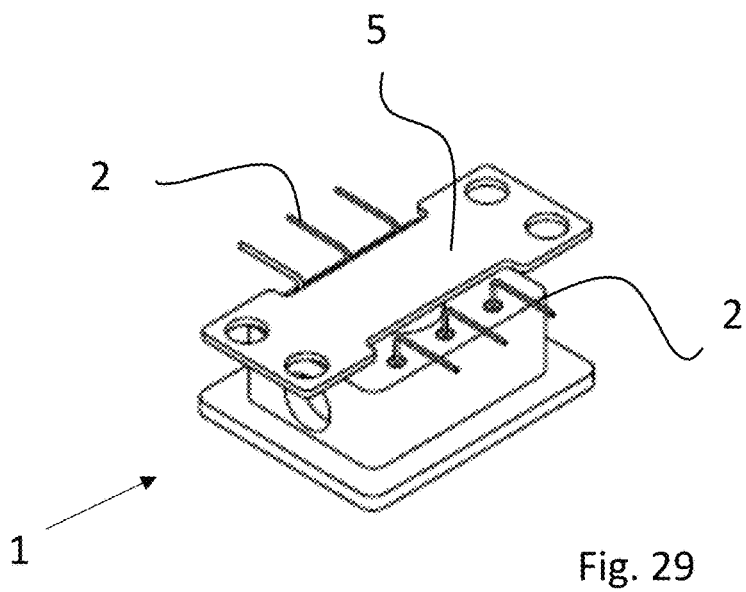
FIG. 29 is a perspective view of a housing with only 6 pins.

FIG. 29 shows a further exemplary embodiment of a housing 1 which has only 6 pins.

The housing comprises a heat sink 5.

Pins 2 are angled laterally outwards, therefore this is an SMD device.

Figure 30:
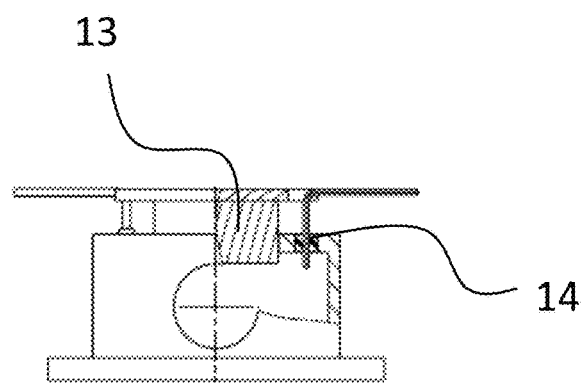
FIG. 30 is a partially cut-away view of the housing of FIG. 29.

FIG. 30 shows a partially cut-away view of FIG. 29.

As can be seen in this exemplary embodiment, a substantially round projection 13 of the heat sink protrudes into the interior of the housing.

The height of the components mounted within the housing can thus be adapted to the level of the contact portion of the pin extending through feedthrough 14.

Figure 31:
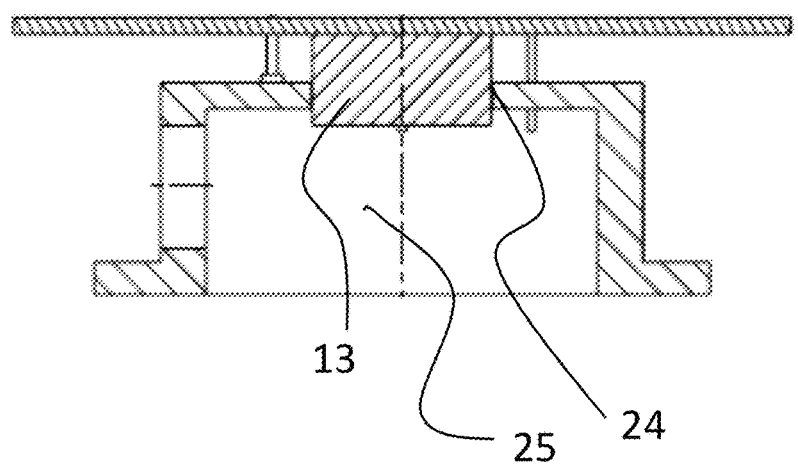
FIG. 31 is a sectional view of the housing of FIG. 29.

In the sectional view of FIG. 31 it can be seen that the projection 13 of the heat sink protrudes into the interior 25 of the housing.

In this exemplary embodiment, the solder connection 24 is made laterally.

Figure 32:
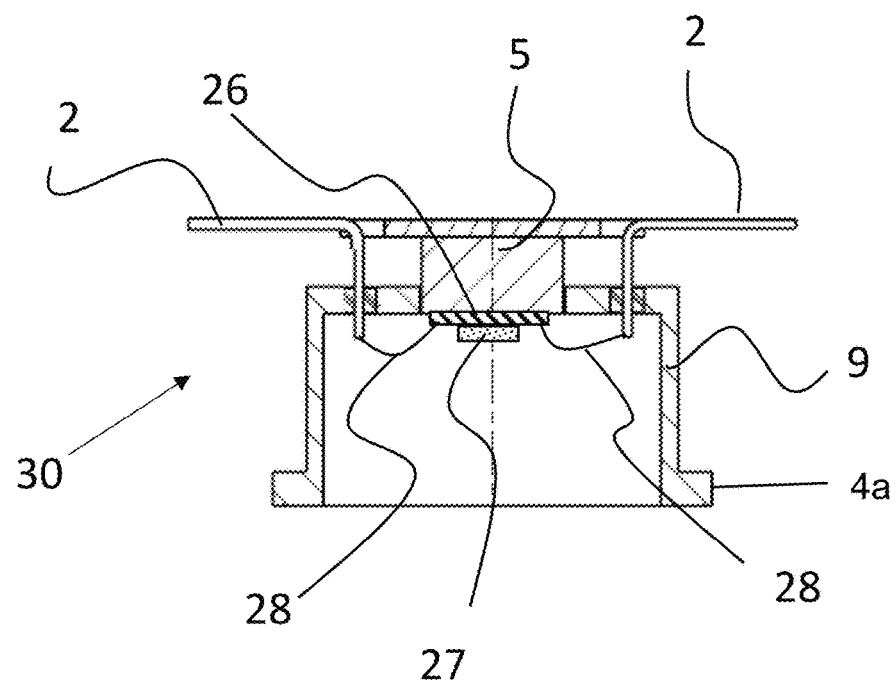
FIG. 32 is a sectional view of one exemplary embodiment of an equipped housing.

FIG. 32 shows a sectional view of an equipped housing, that means of a laser module 30.

The laser module 30 according to this exemplary embodiment comprises angled pins 2 and therefore is designed as an SMD device.

The heat sink 5 is inserted in an opening in the base wall of the basic body 9 of the housing.

In this manner it is possible for a thermoelectric cooler 26 in the form of a Peltier element to be directly applied to the heat sink 5.

Thermoelectric cooler 26 is connected to pins 2 via wires 28.

A high-power laser diode 27 is mounted on the thermoelectric cooler 26.

It will be understood that this laser diode 27, too, will be electrically connected via wires that extend to pins, which wires however are not visible in this view.

Furthermore, the laser module 30 preferably comprises a thermistor by which the thermoelectric cooler 26 is controlled so as to keep the temperature of laser diode 27 constant during operation.

Figure 33:
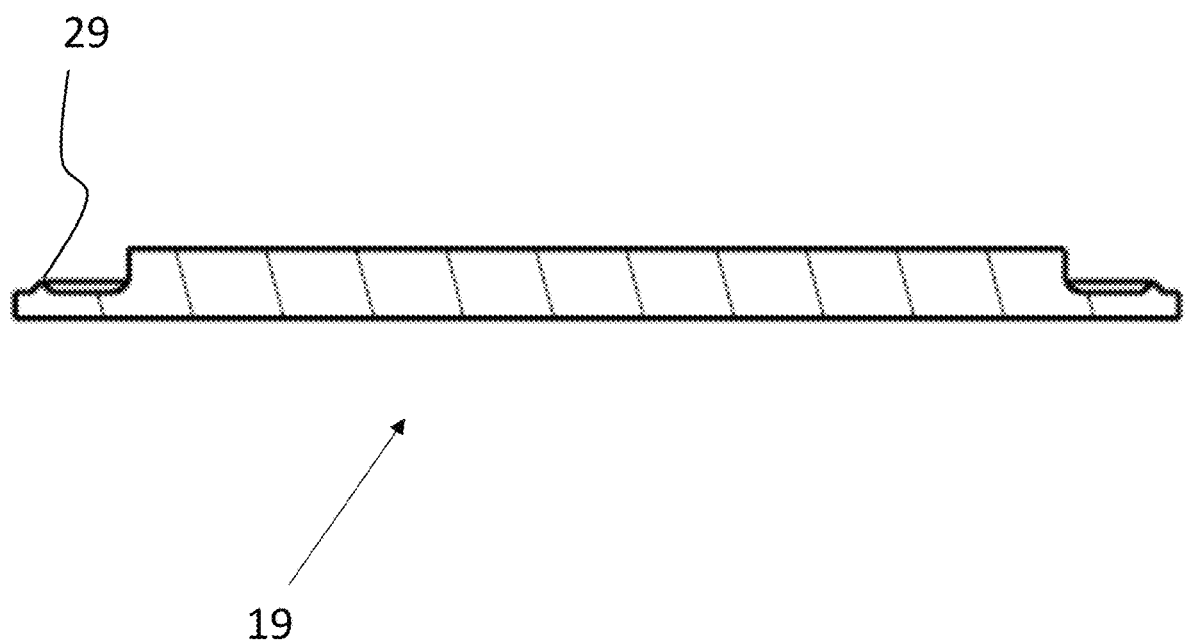
FIG. 33 is a sectional view of a cover that can be used for all illustrated embodiments.

FIG. 33 shows a detailed view of a cover 19 which can be used to close the housing shown in FIG. 32, but also the housings shown in the other exemplary embodiments.

Cover 19 has a circumferential ridge 29 which is adapted for securing the cover 19 to the basic body by resistance welding.

When the cover 19 is placed on the collar 4a of the basic body 9, current density during resistance welding will be at a maximum in the area of ridge 29, so that heating of this area will be caused whereby the components are welding together.

It is equally conceivable to provide the ridge 29 on the collar 4a of the basic body 9 (not shown).

Alternatively, a cover without ridge may also be used and may be applied by roll seam welding, for example.

The invention permits to provide a housing with high temperature resistance for high-power components such as laser diodes, which can be manufactured in a simple manner.

LIST OF REFERENCE NUMERALS

| | |
|---|---|
| 1 | Housing |
| 2 | Pin |
| 2a | Grounding pin |
| 3 | Lower end |
| 4 | Upper end |
| 5 | Heat sink |
| 6 | Bore |
| 7 | Recess |
| 8 | Base wall |
| 9 | Basic body |
| 10 | Contact portion |
| 11 | Feedthrough |
| 12 | Plate |
| 13 | Projection |
| 14 | Feedthrough |
| 15 | Glazing |
| 16 | Insert |
| 17 | Sleeve |
| 18 | Recess |
| 19 | Cover |
| 20 | Collar |
| 21 | Opening |
| 22 | Indentation |
| 23 | Lateral wall |
| 24 | Solder connection |
| 25 | Interior |
| 26 | Thermoelectric cooler |
| 27 | Laser diode |
| 28 | Wire |
| 29 | Ridge |
| 30 | Laser module |

What is claimed is:

1. A housing for an electronic component, comprising:
a heat sink for a thermoelectric cooler; and
a basic body having an upper end and a lower end and a mounting area for the electronic component located therebetween,
wherein the basic body has a lateral wall with a first feedthrough provided therein, the first feedthrough being configured to receive a light guide,
wherein the basic body has a base wall having the heat sink and having a plurality of second feedthroughs, the heat sink protruding beyond the base wall of the basic body, the plurality of second feedthroughs being configured to receive pins electrically connecting the electronic component, and
wherein the heat sink has a coefficient of thermal expansion that is greater than a coefficient of thermal expansion of the basic body.

2. The housing as claimed in claim 1, wherein the plurality of second feedthroughs provided in the form of a glazing.

3. The housing as claimed in claim 1, wherein the plurality of second feedthroughs are arranged adjacent to the heat sink.

4. The housing as claimed in claim 1, wherein the basic body is a deep drawn part.

5. The housing as claimed in claim 1, wherein the basic body is made of metal.

6. The housing as claimed in claim 1, wherein the base wall has an opening for the heat sink.

7. The housing as claimed in claim 1, wherein the basic body has a form fitting feature, wherein the form fitting feature is configured to allow for only a single insertion orientation of an assembly tool.

8. The housing as claimed in claim 7, wherein the form fitting feature comprises an indentation in a lateral wall thereof.

9. A laser module comprising the housing as claimed in claim 1, and further comprising at least a thermoelectric cooler and a laser diode mounted in the housing.

10. The laser module as claimed in claim 9, wherein the laser module comprises a laser diode with a maximum output power of at least 200 mW.

11. The laser module as claimed in claim 10, wherein the laser diode emits electromagnetic radiation of a wavelength from 900 to 1000 nm.

12. The laser module as claimed in claim 10, further comprising a thermistor mounted in the housing, the thermistor being adapted to control a temperature of the laser diode using the thermoelectric cooler.

13. The housing as claimed in claim 1, wherein the basic body is made of steel or an iron-nickel alloy.

14. The housing as claimed in claim 1, wherein the basic body has a coefficient of thermal expansion between 5 and 20 ppm/K.

15. The housing as claimed in claim 1, wherein the base wall of the basic body has an increased thickness around the feedthroughs for the pins, and wherein the increased thickness is in comparison with an adjacent area.

16. The housing as claimed in claim 1, wherein the heat sink is made of copper or of a copper alloy.

17. The housing as claimed in claim 1, wherein the heat sink comprises at least two materials having different coefficients of thermal expansion.

18. The housing as claimed in claim 1, wherein the basic body has a circumferential ridge.

19. The housing as claimed in claim 1, further comprising a cover that closes the basic body, the cover having a circumferential ridge.

20. A housing for an electronic component, comprising:
a heat sink for a thermoelectric cooler; and
a basic body having an upper end and a lower end and a mounting area for the electronic component located therebetween; and
a cover that closes the lower end of the basic body,
wherein the basic body has a lateral wall between the upper and lower ends with a first feedthrough provided therein, the first feedthrough being configured to receive a light guide, and
wherein the basic body has a base wall at the upper end having the heat sink and having a plurality of second feedthroughs, the heat sink protruding beyond the base wall of the basic body to an exterior to the basic body, the plurality of second feedthroughs being configured to receive pins electrically connecting the electronic component,
wherein the heat sink is orientated parallel to the base wall of the basic body.

21. A housing for an electronic component, comprising:
a heat sink for a thermoelectric cooler;
a basic body having an upper end and a lower end and a mounting area for the electronic component located therebetween; and
a cover that closes the lower end of the basic body,
wherein the basic body has a lateral wall between the upper and lower ends with a first feedthrough provided therein,
wherein the basic body has a base wall having a plurality of second feedthroughs, the plurality of second feedthroughs being configured to receive pins electrically connecting the electronic component, and
wherein the base wall has an opening where the heat sink is secured, the heat sink has a projection that protrudes to an exterior of the base wall and does not protrude into the mounting area.

22. A housing for an electronic component, comprising:
a heat sink for a thermoelectric cooler;
a basic body having an upper end and a lower end and a mounting area for the electronic component located therebetween; and
a cover that closes the lower end of the basic body,
wherein the basic body has a lateral wall between the upper and lower ends with a first feedthrough provided therein, the first feedthrough being configured to receive a light guide,
wherein the basic body has a base wall at the upper end having the heat sink and having a plurality of second feedthroughs, the heat sink protruding beyond the base wall of the basic body to an exterior to the basic body, the plurality of second feedthroughs being configured to receive pins electrically connecting the electronic component, and
wherein the heat sink has a coefficient of thermal expansion that is greater than a coefficient of thermal expansion of the basic body.

* * * * *